United States Patent
Koh et al.

(10) Patent No.: US 7,557,382 B2
(45) Date of Patent: Jul. 7, 2009

(54) DISPLAY DEVICE AND MANUFACTURING METHOD OF THE SAME

(75) Inventors: Byung-sik Koh, Gyeonggi-do (KR); Joon-hoo Choi, Gyeonggi-do (KR); Jong-moo Huh, Gyeonggi-do (KR); Joon-chul Goh, Gyeonggi-do (KR); Young-soo Yoon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 11/702,849

(22) Filed: Feb. 5, 2007

(65) Prior Publication Data
US 2007/0181881 A1    Aug. 9, 2007

(30) Foreign Application Priority Data
Feb. 6, 2006    (KR) ...................... 10-2006-0011274
Dec. 22, 2006    (KR) ...................... 10-2006-0132948

(51) Int. Cl.
*H01L 27/15*    (2006.01)
(52) U.S. Cl. .............................. 257/82; 257/84; 257/88; 257/184; 257/257; 257/E51.001
(58) Field of Classification Search .................. 257/82, 257/84, 88, 99, 184, 257
See application file for complete search history.

(56) References Cited
U.S. PATENT DOCUMENTS
2002/0027229 A1*   3/2002   Yamazaki et al. ............. 257/84
2004/0227707 A1*   11/2004   Inukai ......................... 345/76
2006/0097965 A1*   5/2006   Deane et al. .................. 345/76

FOREIGN PATENT DOCUMENTS
JP    2003-005697    1/2003
JP    2003-317944    11/2003
JP    2004-303731    10/2004

(Continued)

OTHER PUBLICATIONS

English Language Abstract, JR Patent First Publication No. 1020050082959, Aug. 24, 2005, 1 page.

(Continued)

*Primary Examiner*—Wai-Sing Louie
(74) *Attorney, Agent, or Firm*—Haynes and Boone, LLP

(57) ABSTRACT

A display device according to the present invention comprises an insulating substrate; a switching thin film transistor formed on the insulating substrate for receiving a data voltage has a first semiconductor layer comprising amorphous silicon; a driving thin film transistor formed on the insulating substrate, having a control terminal connected with an output terminal of the switching thin film transistor and includes a second semiconductor layer comprising poly silicon; a light sensor formed on the insulating substrate and comprises a third semiconductor layer and a sensor input terminal and a sensor output terminal electrically connected with the third semiconductor layer; an insulating layer formed on the light sensor; a first electrode formed on the insulating layer and electrically connected with an output terminal of the driving thin film transistor; an organic layer formed on the first electrode and comprises a light emitting layer; a second electrode formed on the organic layer; and a controller which controls the data voltage based on an output of the light sensor.

16 Claims, 15 Drawing Sheets

FOREIGN PATENT DOCUMENTS

| | | |
|---|---|---|
| JP | 2005-019353 | 1/2005 |
| KR | 1020050082959 | 8/2005 |

OTHER PUBLICATIONS

English Language Abstract, JP Patent First Publication No. 2005-019353, Jan. 20, 2005, 1 page.

English Language Abstract, JP Patent First Publication No. 2004-303731, Oct. 28, 2004, 1 page.

English Language Abstract, JP Patent First Publication No. 2003-317944, Nov. 7, 2003, 1 page.

English Language Abstract, JP Patent First Publication No. 2003-005697, Jan. 8, 2003, 1 page.

\* cited by examiner

DISPLAY DEVICE AND MANUFACTURING METHOD OF THE SAME

CROSS-REFERENCE TO RELATED APPLICATIONS

This application claims priority from Korean Patent Application Nos. 2006-0011274, filed on Feb. 6, 2006, and 2006-0132948, filed on Dec. 22, 2006, in the Korean Intellectual Property Office, the disclosures of which are incorporated herein by reference.

BACKGROUND OF THE INVENTION

1. Field of the Invention

This invention relates a display device and a method of manufacturing the same.

2. Description of the Related Art

Recently, the organic light emitting diode (OLED) has been of interest since it can be driven by a low voltage, is light and small, has a wide viewing angle, and has a high speed of response.

The OLED typically has a plurality of thin film transistors per pixel.

Generally, one pixel includes at least two thin film transistors, i.e., a switching transistor connected with a data line, and a driving transistor connected with a voltage supply line. The thin film transistors typically employ amorphous silicon for a semiconductor layer. When the semiconductor layer made of the amorphous silicon is used for a long time, the quality of the semiconductor layer becomes unstable. Also, an organic layer which generates light deteriorates if used for a long time, thereby lowering its ability to emit light.

SUMMARY OF THE INVENTION

According to an aspect of the present invention, a display device which exhibits stable display quality, comprises an insulating substrate; a switching thin film transistor formed on the insulating substrate that receives a data voltage and has a first semiconductor layer comprising amorphous silicon; a driving thin film transistor formed on the insulating substrate, that has a control terminal connected with an output terminal of the switching thin film transistor and includes a second semiconductor layer comprising poly silicon; a light sensor formed on the insulating substrate and comprises a third semiconductor layer and a sensor input terminal and a sensor output terminal electrically connected with the third semiconductor layer; an insulating layer formed on the light sensor; a first electrode formed on the insulating layer and electrically connected with an output terminal of the driving thin film transistor; an organic layer formed on the first electrode and comprises a light emitting layer; a second electrode formed on the organic layer; and a controller that controls the data voltage based on an output of the light sensor.

According to an aspect of the invention, the third semiconductor layer comprises amorphous silicon.

According to an aspect of the invention, the first semiconductor layer and the third semiconductor layer are the same layer.

According to an aspect of the invention, a control terminal of the switching thin film transistor is formed between the first semiconductor layer and the insulating substrate.

According to an aspect of the invention, the display device further comprises a metal layer which is disposed between the insulating substrate and the third semiconductor layer and prevents external light from being incident to the third semiconductor layer.

According to an aspect of the invention, the metal layer receives a negative voltage.

According to an aspect of the invention, the control terminal of the switching thin film transistor and the metal layer are the same layer.

According to an aspect of the invention, the control terminal of the driving thin film transistor is formed between the second semiconductor layer and the insulating layer.

According to an aspect of the invention, the third semiconductor layer comprises poly silicon.

According to an aspect of the invention, the second semiconductor layer and the third semiconductor layer are the same layer.

According to an aspect of the invention, the display device further comprises a metal layer which is formed between the insulating substrate and the third semiconductor layer and prevents external light from being incident to the third semiconductor layer.

According to an aspect of the invention, the metal layer receives a negative voltage.

According to an aspect of the invention, the control terminal of the driving thin film transistor is disposed between the second semiconductor layer and the insulating substrate, and the control terminal of the driving thin film transistor and the metal layer are the same layer.

According to an aspect of the invention, the light emitting layer emits a white light, the display device further comprising a color filter which is disposed between the organic layer and the insulating substrate.

According to an aspect of the invention, the display device further comprises a sensor thin film transistor which is connected with the sensor input terminal of the light sensor, wherein the sensor input terminal of the light sensor is connected with a drain electrode of the sensor thin film transistor.

According to an aspect of the invention, the display device according to claim 15, further comprising a sensor line which is connected with a source electrode of the sensor thin film transistor and supplies a uniform voltage.

The foregoing and/or other aspects of the present invention can be achieved by the following manufacturing steps: forming a switching thin film transistor which has a first semiconductor layer comprising amorphous silicon, forming a driving thin film transistor which has a control terminal connected with an output terminal of the switching thin film transistor and a second semiconductor layer comprising poly silicon; forming a light sensor which comprises a third semiconductor layer simultaneously formed with the first semiconductor layer, a sensor input terminal and a sensor output terminal formed simultaneously with the output terminal of the switching thin film transistor and electrically connected with the third semiconductor layer, and a metal layer simultaneously formed with a control terminal of the switching thin film transistor and preventing external light from being incident to the third semiconductor layer; forming an insulating layer on the light sensor; forming a first electrode on the insulating layer to be electrically connected with an output terminal of the driving thin film transistor; forming an organic layer having a light emitting layer on the first electrode; and forming a second electrode on the organic layer.

According to an aspect of the invention, the forming of the second semiconductor layer comprises depositing an amorphous silicon layer and an n+ amorphous silicon layer sequentially; and patterning and crystallizing the amorphous silicon layer and the n+ amorphous silicon layer.

According to an aspect of the invention, the crystallizing of the amorphous silicon layer and the n+ amorphous silicon layer uses a solid phase crystallization method.

BRIEF DESCRIPTION OF THE DRAWINGS

The above and/or other aspects and advantages of the present invention will become apparent and more readily appreciated from the following description of the embodiments, taken in conjunction with the drawings in which.

DETAILED DESCRIPTION OF EMBODIMENTS

Figure 1:
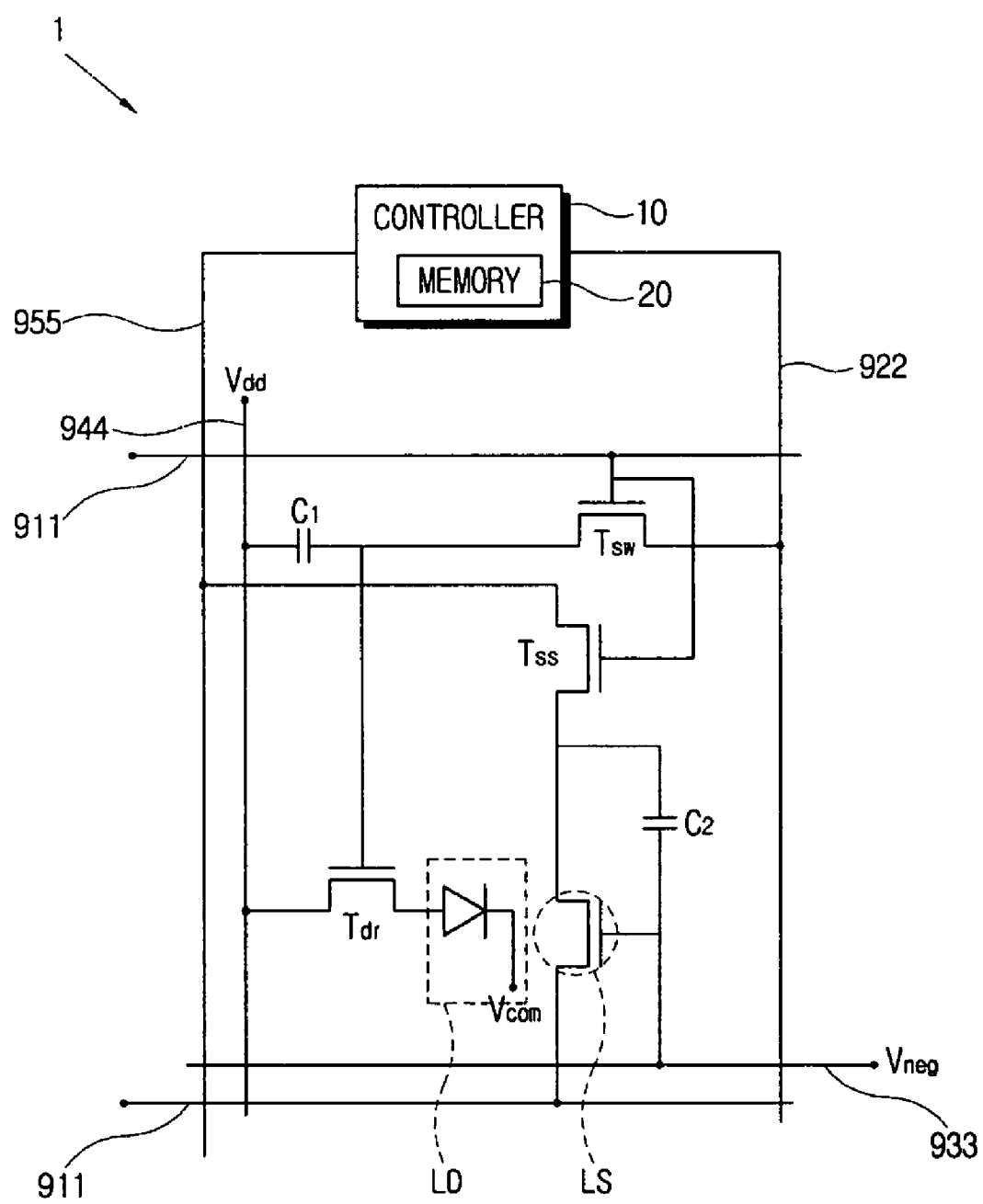
FIG. 1 illustrates an equivalent circuit of a display device according to a first exemplary embodiment of the present invention.

FIG. 1 illustrates an equivalent circuit of a display device according to a first exemplary embodiment of the present invention that includes a plurality of signal lines.

The signal lines include a gate line 911 which transmits a scanning signal, a negative electrode line 933 which supplies a negative voltage, a data line 922 which transmits a data signal, a voltage supply line 944 which transmits a driving voltage, and a sensor line 955 which is connected with a light sensor LS.

Each of pixels includes an organic light emitting element LD, a switching thin film transistor Tsw, a driving thin film transistor Tdr, a sensor thin film transistor Tss, the light sensor LS and capacitors C1 and C2.

The driving thin film transistor Tdr includes a control terminal, an input terminal, and an output terminal. The control terminal is connected with the switching thin film transistor Tsw. The input terminal is connected with the voltage supply line 944. The output terminal is connected with the organic light emitting element LD.

The organic light emitting element LD includes an anode which is connected with the output terminal of the driving thin film transistor Tdr;

and a cathode which is supplied with a common voltage Vcom. The organic light emitting element LD emits lights of different brightness depending on the output current of the driving thin film transistor Tdr, thereby displaying an image. The output current of the driving thin film transistor Tdr varies depending on the voltage applied between the control terminal and the output terminal.

The switching thin film transistor Tsw includes a control terminal, an input terminal, and an output terminal. The control terminal is connected with the gate line 911, and the input terminal is connected with the data line 922. The output terminal of the switching thin film transistor Tsw is connected with the control terminal of the driving thin film transistor Tdr.

The switching thin film transistor Tsw transmits the data signal from the data line to the driving thin film transistor Tdr according to the scanning signal supplied through the gate line.

The capacitor C1 is connected between the control terminal and the input terminal of the driving thin film transistor Tdr. The capacitor C1 charges and maintains the data signal inputted to the control terminal of the driving thin film transistor Tdr.

The organic light emitting element LD deteriorates and its performance becomes lower while being driven. The sensor thin film transistor Tss, the light sensor LS, the capacitor C2 and the negative electrode line 933 compensate for the deterioration of the switching thin film transistor Tsw and the driving thin film transistor Tdr.

The sensor thin film transistor Tss includes a control terminal, an input terminal, and an output terminal. The control terminal is connected with the gate line 911. The input terminal is connected with the sensor line 955. The output terminal is connected with the light sensor LS and the capacitor C2.

The capacitor C2 is connected between the output terminal of the sensor thin film transistor Tss and the negative electrode line 933. The capacitor C2 charges and maintains the voltage input to the input terminal of the sensor thin film transistor Tss.

The light sensor LS includes a semiconductor layer, an input terminal which is connected with a first end of the semiconductor layer and the output terminal of the sensor thin film transistor Tss, and an output terminal which is connected with a second end of the semiconductor layer and the next gate line 911.

While receiving light from the organic light emitting element LD, the semiconductor layer of the light sensor LS decreases in resistance and a current flows in the semiconductor layer. If light is incident to the semiconductor layer, the current flows from the input terminal to the output terminal of the light sensor LS, thereby decreasing the charge on capacitor C2. The stronger the incident light is, the more the current flows to the output terminal, thereby further decreasing the charge on capacitor C2.

Thus, more current is required to be supplied through the sensor line 955.

Even if the same data voltage is applied, the intensity of light incident to the semiconductor layer of the light sensor LS decreases depending on the deterioration of the organic light emitting element LD.

As described above, there is a correlation among the intensity of light incident from the organic light emitting element LD to the semiconductor layer, the intensity of the current flowing in the output terminal of the light sensor LS, the decreased charge on capacitor C2, and the amount of current supplied through sensor line 955 that is required to compensate for the decreased charge on capacitor C2.

A controller 10 controls the data voltage supplied to the data line 922 on the basis of the amount of the current supplied through the sensor line 955, thereby compensating for the deterioration of the organic light emitting element LD.

A memory 20 is connected with the controller 10 and stores a table of current values supplied through the sensor line 955 according to levels of the data voltage. The controller 10 compensates the deterioration of the organic light emitting element LD to various data voltages by the table in the memory 20.

Hereinafter, a configuration of the display device 1 will be described in detail with reference to FIG. 2.

A driving gate electrode 210 is formed on an insulating substrate 110 which includes transparent glass. The driving gate electrode 210 is covered with a first insulating layer 510. A contact hole 542 is formed on the first insulating layer 510 to expose the driving gate electrode 210 therethrough. Also, a second insulating layer 520 and a third insulating layer 530 is partially removed to form the contact hole 542.

A second semiconductor layer 220 is formed on the first insulating layer 510 corresponding to the driving gate electrode 210. The second semiconductor layer 220 includes poly silicon. An ohmic contact layer 230 is formed on the second semiconductor layer 220. Here, the ohmic contact layer 230 is separated into two parts with respect to the second semiconductor layer 220. The ohmic contact layer 230 includes n+ poly silicon highly doped with an n-type dopant.

A switching gate electrode 310, a driving source electrode 240, a driving drain electrode 250, and a light blocking layer 410 are provided on the first insulating layer 510 and the ohmic contact layer 230. Those patterns 310, 240, 250 and 410 are formed by patterning the same metal layer.

The second insulating layer 520 is formed on the patterns 310, 240, 250 and 410 and the second semiconductor layer 220 that is not covered by the patterns 310, 240, 250, and 410. A contact hole 543 is formed on the second insulating layer 520 to expose the driving drain electrode 250 therethrough. A part of the third insulating layer 530 is removed to form the contact hole 543.

A first semiconductor layer 320 is formed on the second insulating layer 520 corresponding to the switching gate electrode 310 while a third semiconductor layer 420 is formed on the second insulating layer 520 corresponding to the light blocking layer 410.

The first and third semiconductor layers 320 and 420 include amorphous silicon layers, which are formed by patterning the same silicon layer.

Ohmic contact layers 330 and 430 including n+ amorphous silicon highly doped with an n-type dopant are formed on the first semiconductor layer 320 and the third semiconductor layer 420, respectively. The ohmic contact layers 330 and 430 are formed by patterning the same n+amorphous silicon layer.

A switching source electrode 340 and a switching drain electrode 350 are formed on the ohmic contact layer 330 while a sensor source electrode 440 and a sensor drain electrode 450 are formed on the ohmic contact layer 430. The switching source electrode 340, the switching drain electrode 350, the sensor source electrode 440, and the sensor drain electrode 450 are formed by patterning the same metal layer.

The third insulating layer 530 is formed on the patterns 340, 350, 440 and 450, and the first and third semiconductor layers 320 and 420 that are not covered by those patterns 340, 350, 440, and 450. A contact hole 541 which exposes the switching drain electrode 350 is formed on the third insulating layer 530.

The insulating layers 510, 520 and 530 may include an inorganic material such as silicon nitride (SiNx) or an organic material. The organic material may include benzocyclobutene (BCB) series, olefin series, acrylic resin series, polyimide series, fluoroplastic, etc.

A transparent electrode layer is formed on the third insulating layer 530. The transparent electrode layer includes a driving bridge 610 and a pixel electrode 620. The transparent electrode layer includes a transparent conductive material such as indium tin oxide (ITO) or indium zinc oxide (IZO). The driving bridge 610 electrically connects the switching drain electrode 350 and the driving gate electrode 210 through the contact holes 541 and 542.

The pixel electrode 620 is called an anode, which supplies a hole to an organic layer 800. The pixel electrode 620 is formed on the third semiconductor layer 420. The pixel electrode 620 is connected with the driving drain electrode 250 through the contact hole 543 to receive a pixel current.

A wall 700 is formed between the pixel electrodes 620. The wall 700 divides the pixel electrodes 620 and defines a pixel region. The wall 700 includes a photosensitive material such as acrylic resin, or polyimide resin which has heat resistance and solvent resistance, or an inorganic material such as SiO2 and TiO2. The wall 700 may include a double layer having an organic layer and an inorganic layer.

The organic layer 800 is formed on the pixel electrodes 620 that are not covered by the wall 700. The organic layer 800 includes a light emitting layer. The organic layer 800 may further include an electron injecting layer, an electron transport layer, a hole injecting layer and a hole transport layer.

The hole injecting layer and the hole transport layer may employ an amine derivative which is highly fluorescent, e.g., a triphenyl diamine derivative, a styryl amine derivative, and an amine derivative having an aromatic condensed ring.

The electron transport layer may employ a quinoline derivative, and particularly, aluminum tris(8-hydroxyquinoline) (Alq3). The electron transport layer may also employ a phenyl anthracene derivative and a tetra arylethene derivative. The electron injecting layer may include barium (Ba) or calcium (Ca).

The light emitting layer emits light in one of red, blue, and green colors. Neighboring light emitting layers emit light in different colors.

If the organic layer 800 includes a high molecular material, it may be formed by an ink-jetting method.

The hole injecting layer may include a hole injecting material such as poly(3,4-ethylenedioxy thiophene)(PEDOT) and polystyrene sulfonic acid (PSS). The light emitting layers may include a poly fluorene derivative; a (poly)paraphenylenevinylene derivative; a polyphenylene derivative; polyvinylcarbazole; and a poly thiophene derivative. Further, these high molecular materials can be used by being doped with a perylene pigment; a rothermine pigment; rubrene; perylene; 9,10-diphenylanthracene;
tetraphenylbutadiene; Nile red; coumarine 6; Quinacridone, etc.

A common electrode 830 is disposed on the wall 700 and the organic layer 800. The common electrode 830 is called a cathode, which supplies an electron to the organic layer 800. The common electrode 830 may be formed by stacking a calcium layer and an aluminum layer.

A hole transmitted from the pixel electrodes 620 and an electron transmitted from the common electrode 830 are combined into an exciton on the organic layer 800, thereby emitting light during a deactivation process of the exciton.

The display device 1 may further include a passivation layer (not shown) to protect the common electrode 830 and an encapsulating member (not shown) to prevent moisture and air from being introduced to the organic layer 800. The encapsulating member may include a sealing resin and a sealing can.

According to the first exemplary embodiment of the present invention, the switching thin film transistor Tsw is an amorphous silicon thin film transistor in which the first semiconductor layer 320 includes amorphous silicon, and the driving thin film transistor Tdr is a poly silicon thin film transistor in which the second semiconductor layer 220 includes poly silicon.

The amorphous silicon thin film transistor has a relatively small leakage current, but presents an unstable quality when being used for a long time. On the other hand, the poly silicon thin film transistor provides a stable quality, but has a relatively large leakage current.

The driving thin film transistor Tdr according to an exemplary embodiment of the present invention uses a poly silicon thin film transistor.

In an off state, the light emitting element LD is not turned on with the leakage current of about several nA. Thus, the leakage current is not significant. If the switching thin film transistor Tsw includes a poly silicon thin film transistor, a malfunction such as cross talk occurs due to leakage current.

The driving thin film transistor Tdr according to an exemplary embodiment of the present invention is not seriously affected by current leakage. A poly silicon thin film transistor is employed to maintain the stability of the display device. The switching thin film transistor Tsw uses the amorphous silicon thin film transistor to prevent a malfunction such as cross talk.

The light blocking layer 410 of the light sensor LS is disposed under the light sensor LS, and prevents external light from being incident to the third semiconductor layer 420. The light sensor LS receives light only from the light emitting element LD by the light blocking layer 410.

The light blocking layer 410 receives a negative voltage from the negative electrode line 933 in FIG. 1 and prevents the third semiconductor layer 420 from being activated.

A light blocking layer 410 according to another exemplary embodiment of the present invention may receive a voltage whose maximum output variation depends on light.

The light sensor LS is formed together with the switching thin film transistor Tsw, thereby excluding an additional process for forming the light sensor LS.

The operation of the light sensor LS will be described in detail with reference to FIGS. 1 and 2.

If a gate-on voltage is supplied through the gate line 911, the switching thin film transistor Tsw and the sensor thin film transistor Tss are turned on. While the sensor thin film transistor Tss is turned on, the capacitor C2 is charged.

While the switching thin film transistor Tsw is turned on, a data voltage is transmitted to the switching drain electrode 350 through the data line 922. The data voltage is supplied to the driving gate electrode 210 of the driving thin film transistor Tdr through the driving bridge 610, thereby turning on the driving thin film transistor Tdr.

The driving current is supplied to the driving drain electrode 250 through the driving thin film transistor Tdr which is turned on. The intensity of the driving current is determined by the data voltage. The driving current is transmitted from the driving drain electrode 250 to the pixel electrodes 620. Thus, the organic layer 800 emits light.

Light emitted from the organic layer 800 activates the third semiconductor layer 420, allowing the current to flow from the sensor source electrode 440 to the sensor drain electrode 450. Then, the capacity of the capacitor C2 decreases. Controller 10 controls the data voltage based on the supplied amount of current and recharges capacitor C2. The current supplied to the sensor drain electrode 450 is discharged to the next gate line 911.

Hereinafter, a method of manufacturing the display device 1 according to the first exemplary embodiment of the present invention will be described with reference to FIGS. 3A to 3H.

Figure 3A:
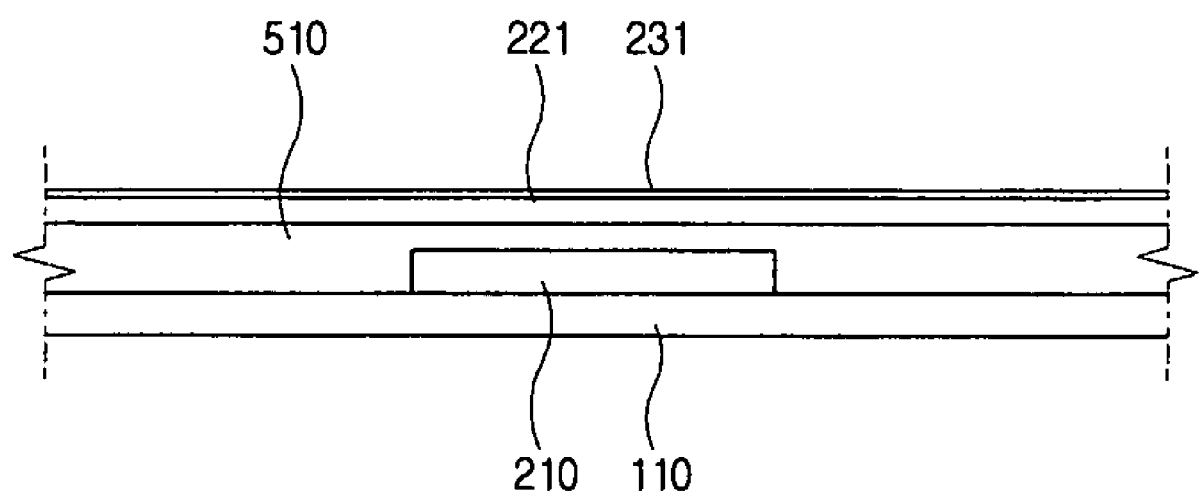
FIGS. 3A to 3H illustrate a manufacturing method of the display device according to the first exemplary embodiment of the present invention.

As shown in FIG. 3A, a metal layer is formed on the insulating substrate 110 and patterned to form the driving gate electrode 210. Then, the first insulating layer 510, an amorphous silicon layer 221, and an n+ amorphous silicon layer 231 are formed on the driving gate electrode 210.

If the first insulating layer 510 includes silicon nitride, the first insulating layer 510, the amorphous silicon layer 221 and the n+ amorphous silicon layer 231 may be simultaneously formed on the same chamber.

Figure 3B:
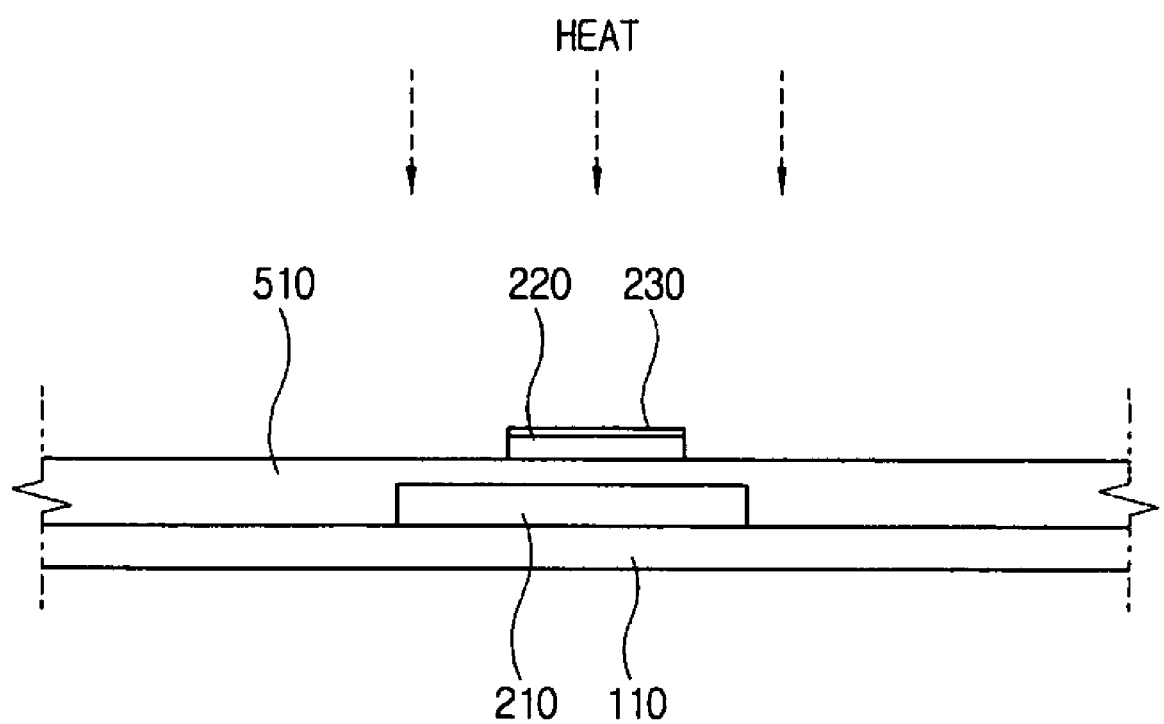

As shown in FIG. 3B, the amorphous silicon layer 221 and the n+ amorphous silicon layer 231 are patterned and crystallized to form the second semiconductor layer 220 and the ohmic contact layer 230 which include poly silicon. The patterned amorphous silicon layer 221 and the patterned n+ amorphous silicon layer 231 are all changed into poly silicon through the crystallization.

An amorphous silicon layer 221 and an n+ amorphous silicon layer 231 according to another exemplary embodiment of the present invention may be crystallized first and patterned later.

The crystallization may include a solid phase crystallization, a laser crystallization, and a rapid thermal annealing.

The solid phase crystallization refers to a method of producing poly silicon having a large crystallized particle through heat treatment for a long time at a low temperature of 600° C. or below. The laser crystallization is a method of producing poly silicon using a laser, such as an excimer laser annealing (ELA), sequential lateral solidification (SLS), etc. Rapid thermal annealing refers to a method of depositing amorphous silicon at a low temperature and rapidly heating the surface thereof with light.

Figure 3C:
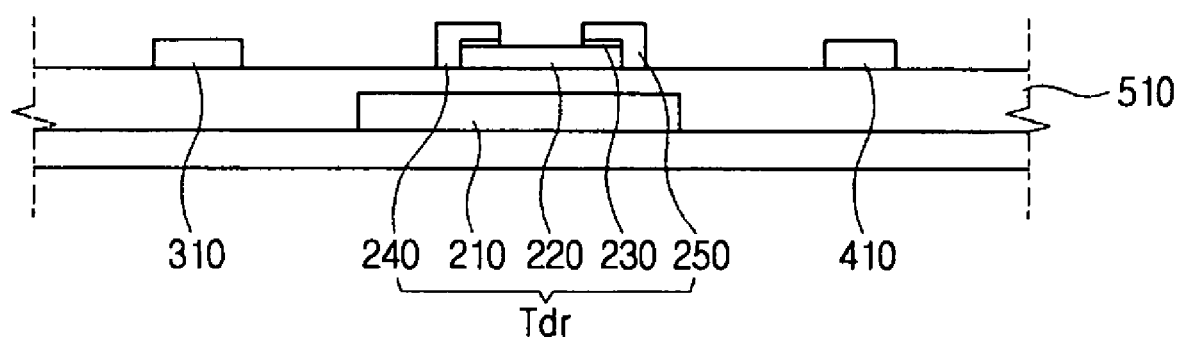

As shown in FIG. 3C, a metal layer is deposited and patterned to form the switching gate electrode 310, the driving source electrode 240, the driving drain electrode 250 and the light blocking layer 410. Here, the ohmic contact layer 230 formed between the driving source electrode 240 and the driving drain electrode 250 is removed, thereby forming the driving thin film transistor Tdr.

Figure 3D:
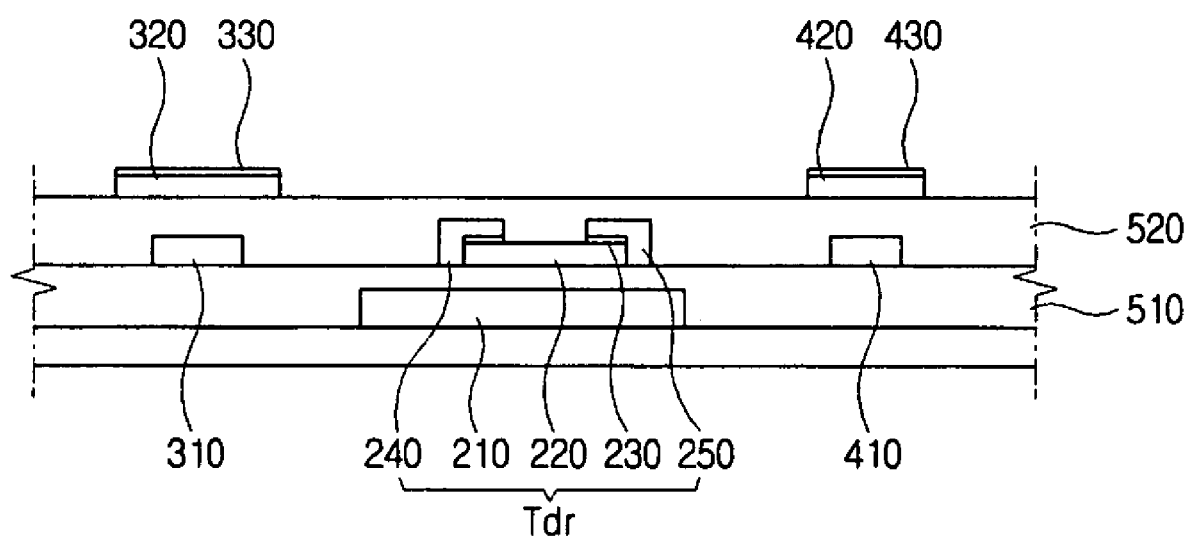

As shown in FIG. 3D, the second insulating layer 520 is formed. The first semiconductor layer 320, the third semiconductor layer 420 and the ohmic contact layers 330 and 430 are then formed on the second insulating layer 520. The process of forming the semiconductor layers 320 and 420 and the ohmic contact layers 330 and 430 will be described.

The amorphous silicon layer and the n+ amorphous silicon layer are sequentially formed on the second insulating layer 520. If the second insulating layer 520 includes silicon nitride, the second insulating layer 520, the amorphous silicon layer and the n+ amorphous silicon layer may be sequentially formed on the same chamber.

Then, the amorphous silicon layer and the n+ amorphous silicon layer are patterned to form the semiconductor layers 320 and 420 and the ohmic contact layers 330 and 430 as shown in FIG. 3D.

Figure 3E:
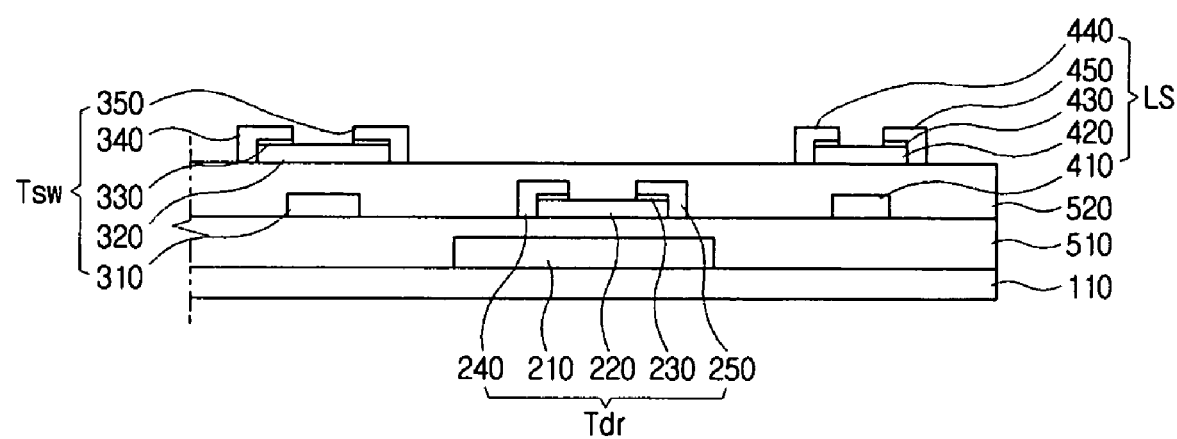

As shown in FIG. 3E, a metal layer is deposited and patterned to form the switching source electrode 340, the switching drain electrode 350, the sensor source electrode 440 and the sensor drain electrode 450. In this process, the ohmic contact layers 330 and 430, which are not covered by the electrodes 340, 350, 440 and 450, are removed, thereby forming the switching thin film transistor Tsw and the light sensor LS.

Figure 3F:
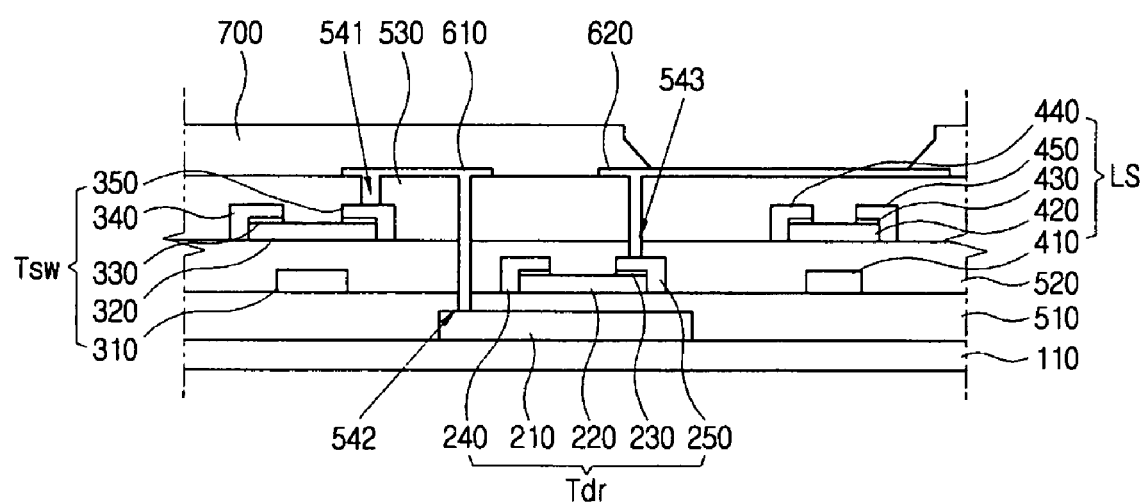

As shown in FIG. 3F, a transparent conductive layer such as ITO, IZO or the like is deposited and photolithographed to form the driving bridge 610 and the pixel electrode 620.

Before the transparent conductive layer is deposited, the insulating layers 510, 520 and 530 are patterned to form the contact holes 541, 542 and 543.

After the driving bridge 610 and the pixel electrodes 620 are formed, a wall material layer is formed throughout the insulating substrate 110, and exposed and developed to form the wall 700. The wall material layer includes a photosensitive material. The wall material layer may be formed by a slit coating, a spin coating or etc.

Figure 3G:
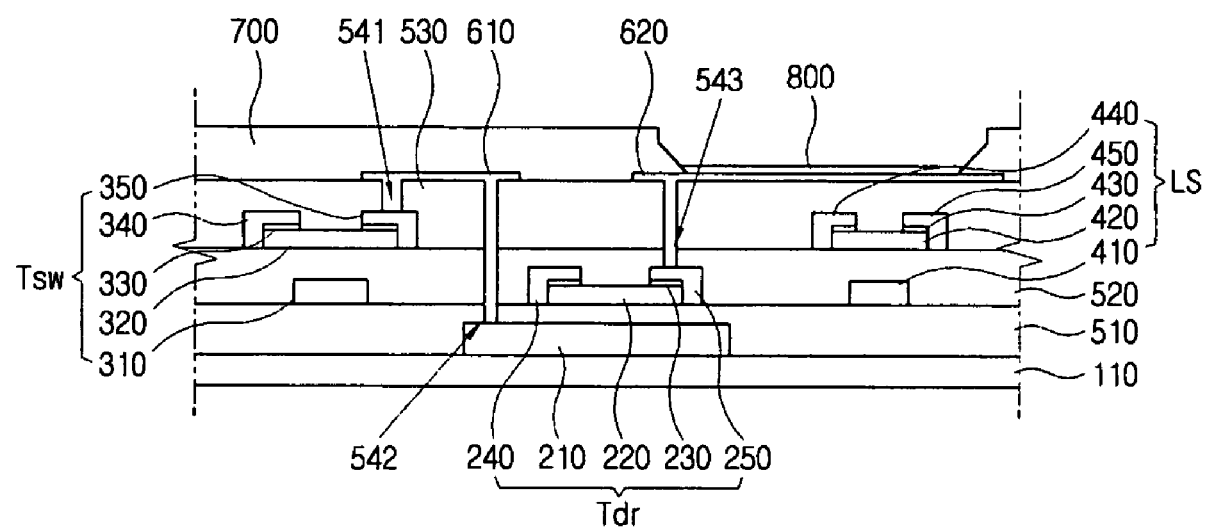
Figure 3H:
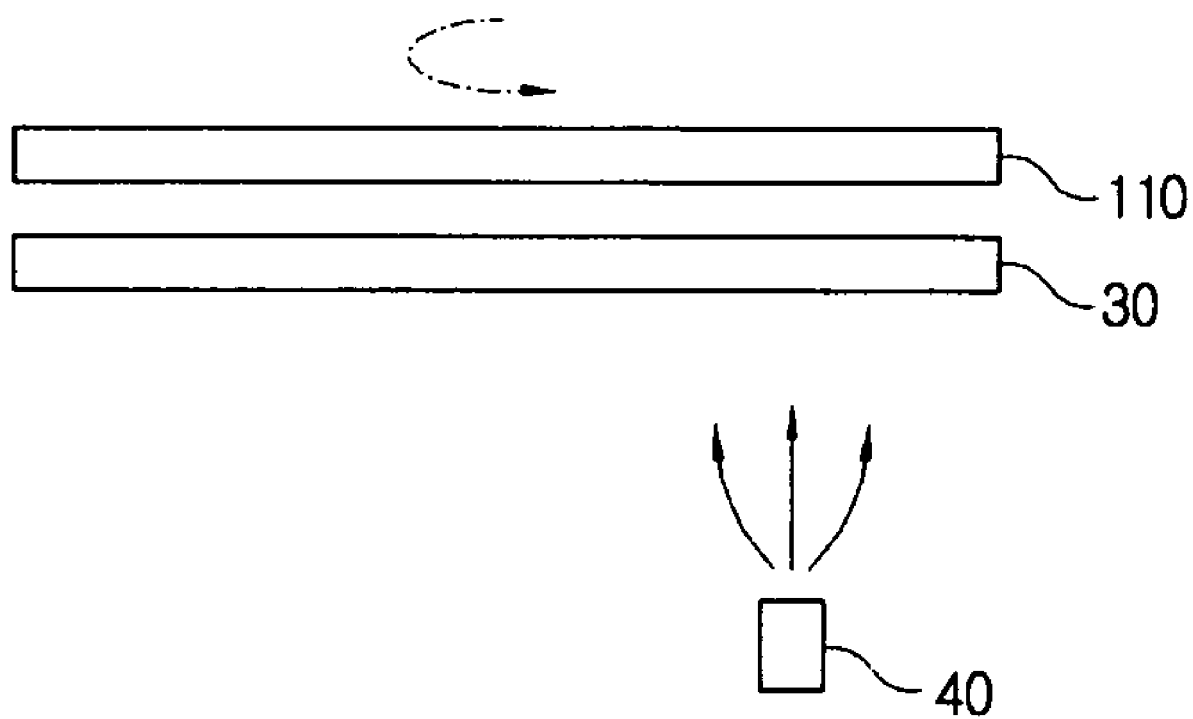

As shown in FIG. 3G, the organic layer 800 is formed. The organic layer 800 includes a plurality of layers having a light emitting layer. The organic layer 800 may be formed by a vaporization method as shown in FIG. 3H.

With the vaporization method, the insulating substrate 110 is arranged so that the pixel electrodes 620 are directed downwards. Then, an organic source 40 below the insulating substrate 110 is heated to supply organic vapor to the pixel electrodes 620.

A shadow mask 30 is disposed between the insulating substrate 110 and the organic source 40. An opening (not shown) is formed in the shadow mask 30.

The organic vapor from the organic source 40 is supplied to the pixel electrode 620 through the opening of the shadow mask 30. The organic vapor contacted to the pixel electrode 620 lowers in temperature and is solidified, thereby forming the organic layer 800.

The insulating substrate 110 rotates to form the organic layer 800 with uniform thickness.

The organic layer 800 according to the first exemplary embodiment of the present invention is formed using the shadow mask 30.

If using an open mask, the organic layer 800 is formed all over the wall 700. If the organic layer 800 includes several layers, some layer may be formed by the open mask while the other layer may be formed by the shadow mask.

Figure 2:
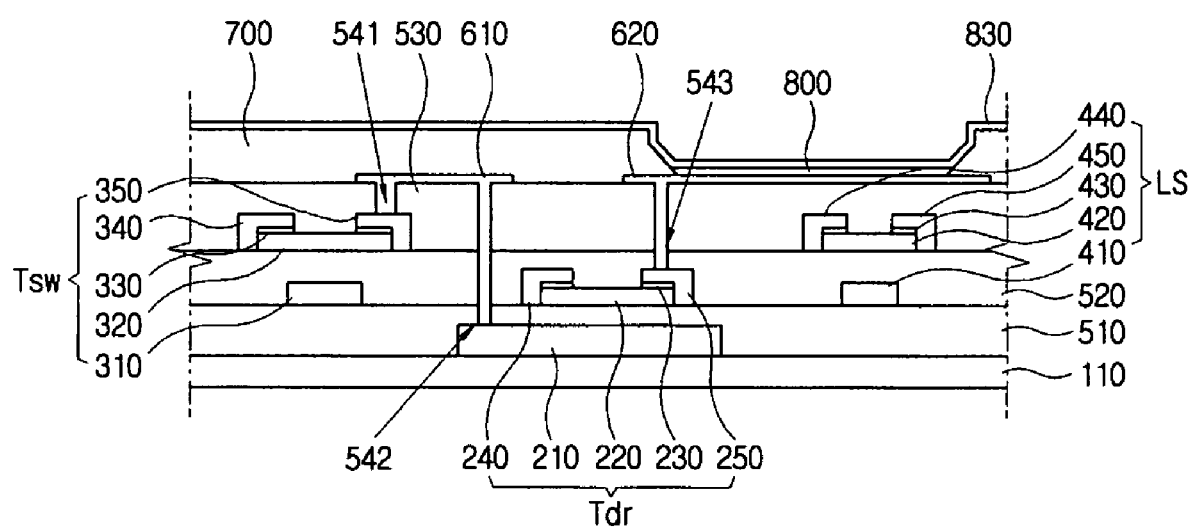
FIG. 2 is a sectional view of the display device according to the first exemplary embodiment of the present invention.

Then, the common electrode 830 is formed to complete the display device 1 as shown in FIG. 2.

Figure 4:
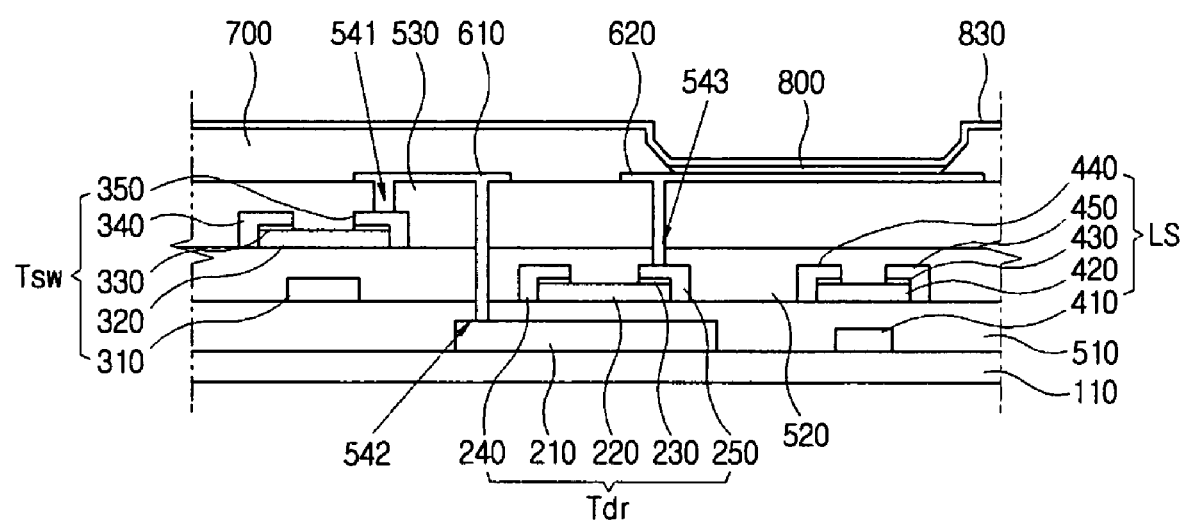
FIG. 4 is a sectional view of a display device according to a second exemplary embodiment of the present invention.

A display device according to a second exemplary embodiment of the present invention will be described with reference to FIG. 4.

A third semiconductor layer 420 of a light sensor LS includes poly silicon, and is formed simultaneously with a second semiconductor layer 220.

A light blocking layer 410 of the light sensor LS is formed as the same layer as a driving gate electrode 210.

If the third semiconductor layer 420 of the light sensor LS includes poly silicon, the light sensor LS is deteriorated slowly, thereby stabilizing a display quality of the display device.

Figure 5:
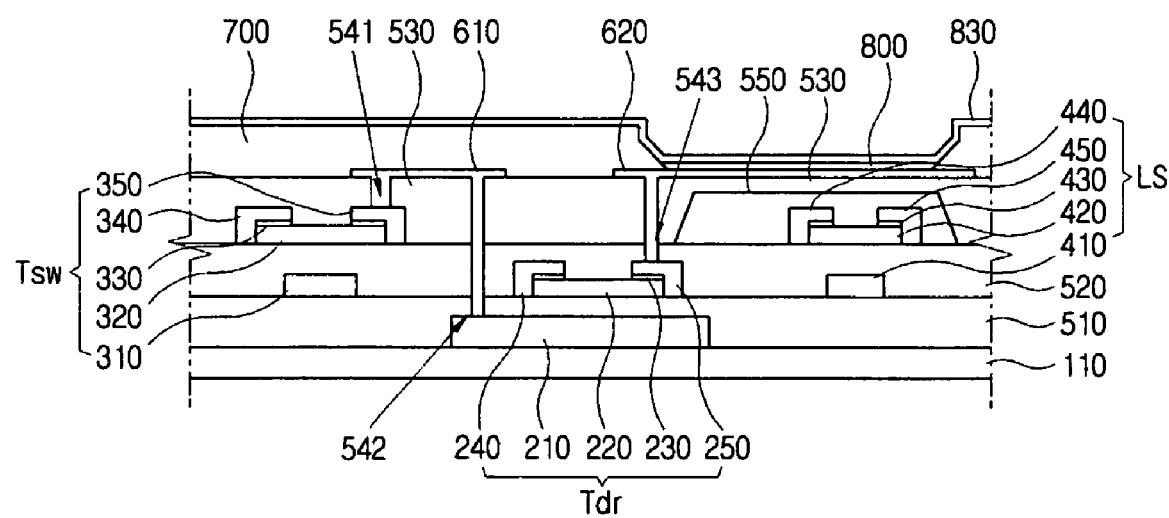
FIG. 5 is a sectional view of a display device according to a third exemplary embodiment of the present invention.

A display device according to a third exemplary embodiment of the present invention will be described with reference to FIG. 5.

An organic layer 800 emits white light. A color filter 530 is formed between a pixel electrode 620 and an insulating substrate 110. The color filter 530 has one of red, green and blue colors.

Figure 6:
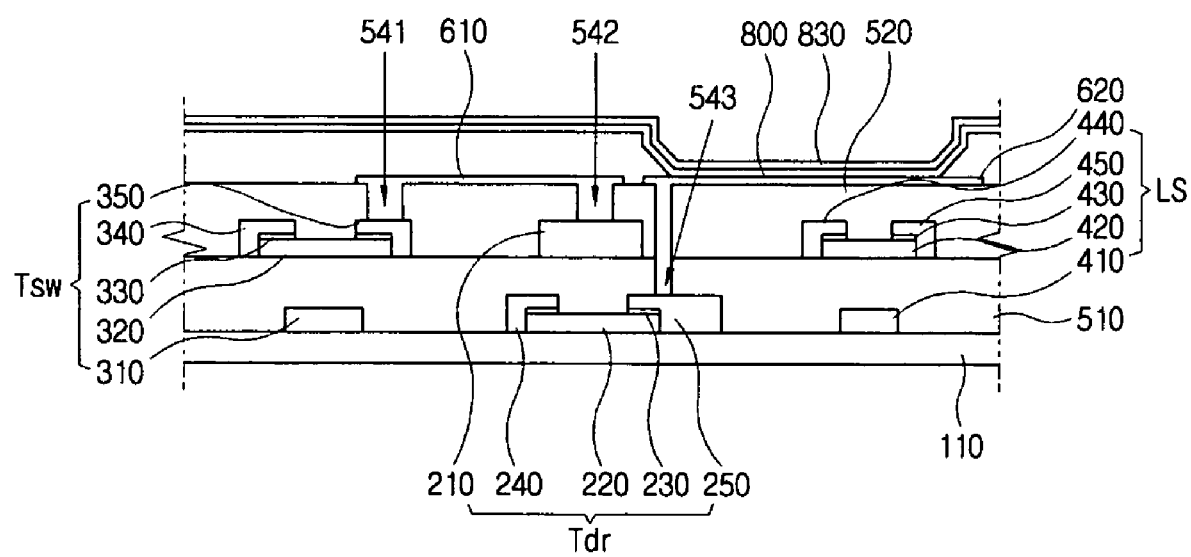
FIG. 6 is a sectional view of a display device according to a fourth exemplary embodiment of the present invention.

A display device according to a fourth exemplary embodiment of the present invention will be described with reference to FIG. 6.

A driving thin film transistor Tdr according to the fourth exemplary embodiment of the present invention employs a top gate type with which a driving gate electrode 210 is disposed on a second semiconductor layer 220. An insulating layer 510 includes a double layer.

First, an amorphous silicon layer and an n+ amorphous silicon layer are deposited on an insulating substrate 110. Then, the amorphous silicon layer and the n+ amorphous silicon layer are patterned and crystallized to form the second semiconductor layer 220 and an ohmic contact layer 230 which include poly silicon.

Then, a switching gate electrode 310, a driving source electrode 240, a driving drain electrode 250 and a light blocking layer 410 are formed. Those patterns 310, 240, 250 and 410 are formed by patterning the same metal layer.

The organic layer 800 according to the second exemplary embodiment of the present invention includes a low molecular material, and is formed all over the wall 700 by the open mask. Meanwhile, a light emitting layer of the organic layer 800 is not formed all over the wall 700 and may be individually formed per pixels.

Figure 7:
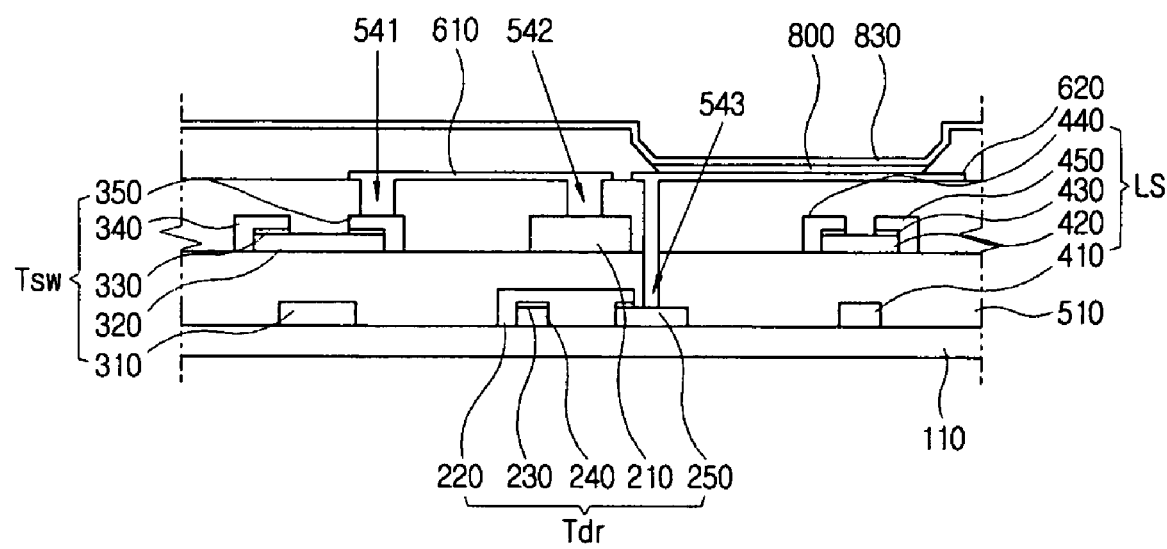
FIG. 7 is a sectional view of a display device according to a fifth exemplary embodiment of the present invention.

A display device according to a fifth exemplary embodiment of the present invention will be described with reference to FIG. 7.

A driving thin film transistor Tdr according to the fifth embodiment of the present invention employs a top gate type like the fourth embodiment. A driving source electrode 240 and a driving drain electrode 250 according to the fifth exemplary embodiment of the present invention are disposed under a second semiconductor layer 220 unlike the fourth embodiment.

A metal layer and an n+ amorphous silicon layer are formed on an insulating substrate 110. Then, the metal layer and the n+ amorphous silicon layer are patterned by a single mask to form a switching gate electrode 310, the driving source electrode 240, the driving drain electrode 250 and a light blocking layer 410. An ohmic contact layer 230 formed on the driving source electrode 240 and the driving drain electrode 250 is not removed.

Then, the amorphous silicon layer is deposited, patterned and crystallized to form the second semiconductor layer 220.

Figure 8:
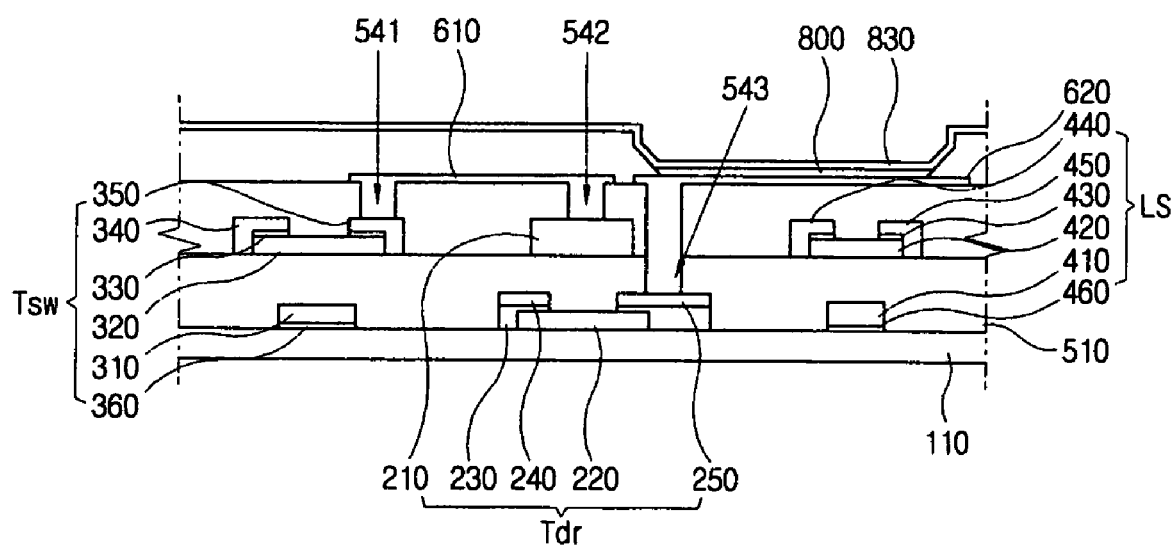
FIG. 8 is a sectional view of a display device according to a sixth exemplary embodiment of the present invention.

A display device according to a sixth embodiment of the present invention will be described with reference to FIG. 8.

A driving thin film transistor Tdr according to the sixth embodiment of the present invention employs a top gate type like the fourth embodiment. An ohmic contact layer 230 according to the sixth embodiment of the present invention extends outside a second semiconductor layer 220 unlike the fourth embodiment. Lower ohmic contact layers 360 and 460 including n+ amorphous silicon are formed under a switching gate electrode 310 and a light blocking layer 410.

An amorphous silicon layer is deposited on an insulating substrate 110. The amorphous silicon layer is patterned and crystallized to form the second semiconductor layer 220. The n+ amorphous silicon layer and a metal layer are formed to be pattered through a single mask, thereby forming the switching gate electrode 310, a driving source electrode 240, a driving drain electrode 250 and the light blocking layer 410.

As the amorphous silicon layer and the metal layer are patterned through the single mask, the ohmic contact layer 230 and the lower ohmic contact layers 360 and 460 including an n+ amorphous silicon layer are formed under the patterns 310, 240, 250 and 410.

As described above, the present invention provides a display device which has a stable display quality and a manufacturing method of the same.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device, comprising:
an insulating substrate;
a switching thin film transistor having an input terminal receiving a data voltage, a control terminal and an output terminal formed on the insulating substrate and having a first semiconductor layer comprising amorphous silicon;
a driving thin film transistor formed on the insulating substrate having a control terminal connected with an output terminal of the switching thin film transistor, the driving transistor including a second semiconductor layer comprising poly silicon;

a light sensor formed on the insulating substrate including a third semiconductor layer, a sensor input terminal and a sensor output terminal electrically connected with the third semiconductor layer;

an insulating layer formed on the light sensor;

a first electrode formed on the insulating layer and electrically connected with an output terminal of the driving thin film transistor;

an organic layer formed on the first electrode including a light emitting layer; a second electrode formed on the organic layer; and a controller which controls the data voltage based on an output of the light sensor.

2. The display device according to claim 1, wherein the third semiconductor layer comprise amorphous silicon.

3. The display device according to claim 2, wherein the first semiconductor layer and the third semiconductor layer are the same layer.

4. The display device according to claim 2, wherein a control terminal of the switching thin film transistor is formed between the first semiconductor layer and the insulating substrate.

5. The display device according to claim 4, further comprising a metal layer which is disposed between the insulating substrate and the third semiconductor layer and prevents external light from being incident to the third semiconductor layer.

6. The display device according to claim 5, wherein the metal layer receives a negative voltage.

7. The display device according to claim 5, wherein the control terminal of the switching thin film transistor and the metal layer are the same layer.

8. The display device according to claim 2, wherein the control terminal of the driving thin film transistor is formed between the second semiconductor layer and the insulating layer.

9. The display device according to claim 1, wherein the third semiconductor layer comprise poly silicon.

10. The display device according to claim 9, wherein the second semiconductor layer and the third semiconductor layer are the same layer.

11. The display device according to claim 9, further comprising a metal layer which is formed between the insulating substrate and the third semiconductor layer and prevents external light from being incident to the third semiconductor layer.

12. The display device according to claim 11, wherein the metal layer receives a negative voltage.

13. The display device according to claim 11, wherein the control terminal of the driving thin film transistor is disposed between the second semiconductor layer and the insulating substrate, and the control terminal of the driving thin film transistor and the metal layer are the same layer.

14. The display device according to claim 1, wherein the light emitting layer emits a white light, the display device further comprising a color filter which is disposed between the organic layer and the insulating substrate.

15. The display device according to claim 1, further comprising a sensor thin film transistor which is connected with the sensor input terminal of the light sensor, wherein the sensor input terminal of the light sensor is connected with a drain electrode of the sensor thin film transistor.

16. The display device according to claim 15, further comprising a sensor line which is connected with a source electrode of the sensor thin film transistor and supplies a uniform voltage.

* * * * *